(12) United States Patent
Ghasemi Afshar

(10) Patent No.: US 9,613,936 B2
(45) Date of Patent: Apr. 4, 2017

(54) LED MODULE INCLUDING AN LED

(71) Applicant: Osram GmbH, Munich (DE)

(72) Inventor: Farhang Ghasemi Afshar, Wenzenbach (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 14/790,033

(22) Filed: Jul. 2, 2015

(65) Prior Publication Data

US 2016/0010808 A1    Jan. 14, 2016

(30) Foreign Application Priority Data

Jul. 11, 2014   (DE) ........................ 10 2014 213 574

(51) Int. Cl.
*F21S 13/10*    (2006.01)
*H01L 25/075*   (2006.01)
*H01L 33/52*    (2010.01)
*H01L 33/62*    (2010.01)

(52) U.S. Cl.
CPC .......... *H01L 25/0753* (2013.01); *H01L 33/52* (2013.01); *H01L 33/62* (2013.01); *H01L 2924/0002* (2013.01)

(58) Field of Classification Search
CPC ......... H01L 25/0753; H01L 2924/0002; H01L 33/52; H01L 33/62
USPC ................................. 362/363, 364, 375, 362
See application file for complete search history.

(56) References Cited

U.S. PATENT DOCUMENTS

2012/0162998 A1    6/2012  Takahashi et al.

FOREIGN PATENT DOCUMENTS

DE            10122002 A1    11/2002

OTHER PUBLICATIONS

German Office Action based on application No. 10 2014 213 574.5 (8 pages) dated Feb. 19, 2015.

*Primary Examiner* — Vip Patel
(74) *Attorney, Agent, or Firm* — Viering, Jentschura & Partner mbB

(57) ABSTRACT

An LED module includes a carrier plate having an arrangement face and a wall on the upper side of the plate, the wall running peripherally around the arrangement face and being raised upwards with respect to said arrangement face; an LED arranged on the face; a contact element, to which the LED is connected; and an at least partially transparent potted body covering the arrangement face and the LED towards the top and laterally adjoins an inner face of the wall. The wall is formed monolithically with the remaining carrier plate and is interrupted over its periphery, and the potted body does not adjoin the inner wall face of the wall. The contact element extends away from the arrangement face along the upper side of the carrier plate in the interruption region so that electrical contact can be made with the LED via the contact element from outside the body.

13 Claims, 6 Drawing Sheets

LED MODULE INCLUDING AN LED

CROSS-REFERENCE TO RELATED APPLICATION

This application claims priority to German Patent Application Serial No. 10 2014 213 574.5, which was filed Jul. 11, 2014, and is incorporated herein by reference in its entirety.

TECHNICAL FIELD

Various embodiments relate generally to an LED module including an LED, which is arranged on a carrier plate.

BACKGROUND

In comparison with conventional incandescent lamps or else fluorescent lamps, optoelectronic light sources being developed at present can be characterized, for example, by improved energy efficiency. The term "LED module" within the scope of this disclosure relates to an optoelectronic assembly, wherein "LED" can generally also mean an organic light-emitting diode and preferably relates to an inorganic light-emitting diode.

SUMMARY

An LED module includes a carrier plate having an arrangement face and a wall on the upper side of the plate, the wall running peripherally around the arrangement face and being raised upwards with respect to said arrangement face; an LED arranged on the face; a contact element, to which the LED is connected; and an at least partially transparent potted body covering the arrangement face and the LED towards the top and laterally adjoins an inner face of the wall. The wall is formed monolithically with the remaining carrier plate and is interrupted over its periphery, and the potted body does not adjoin the inner wall face of the wall. The contact element extends away from the arrangement face along the upper side of the carrier plate in the interruption region so that electrical contact can be made with the LED via the contact element from outside the body.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
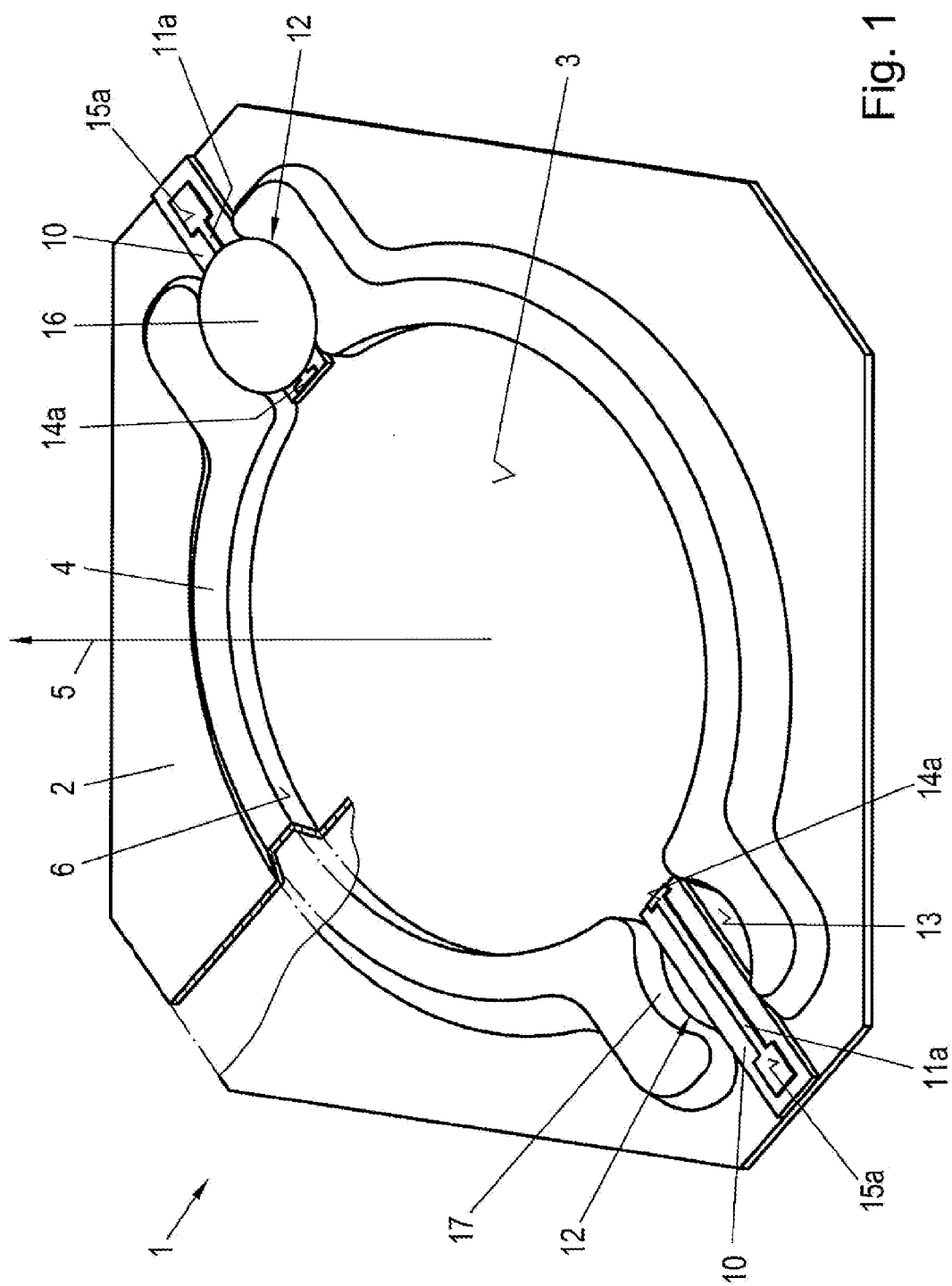
FIG. 1 shows a first LED module according to various embodiments in an angled view from above.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments are based on the technical problem of specifying an LED module and a method for producing said LED module.

In accordance with various embodiments, an LED module is provided including a carrier plate, which has an arrangement face and a wall on the upper side of said carrier plate, said wall running peripherally around the arrangement face and being raised upwards with respect to said arrangement face, an LED, which is arranged on the arrangement face, a contact element, to which the LED is electrically conductively connected, and an at least partially transparent potted body, which covers the arrangement face and the LED towards the top and laterally adjoins an inner wall face of the wall. The wall is formed monolithically with the remaining carrier plate, i.e. is formed from the same continuous carrier plate material. The wall is interrupted over its periphery in an interruption region, and the potted body does not adjoin the inner wall face of the wall there accordingly. In addition, the contact element extends away from the arrangement face along the upper side of the carrier plate in the interruption region so that electrical contact can be made with the LED via the contact element from outside the potted body.

Configurations are set forth in the dependent claims and in the description below, wherein in the representation a distinction has not always been drawn specifically between apparatus and production aspects; in any case, the disclosure should implicitly be interpreted in respect of all claim categories.

During production of a corresponding LED (light emitting diode) module, first the wall is formed from the carrier plate material and then its inner wall face can delimit a cavity which is open at the top, into which (once the LED has been arranged) a potting material can be introduced and cured to form the potted body. The wall in this regard is therefore an auxiliary element for applying the potted body; the latter can be used, for example, for protecting the LED and also for adapting the emission properties of the LED module, for example by virtue of scattering and/or phosphor particles being embedded in the potting material.

By virtue of the wall being formed from the same continuous carrier plate, this auxiliary element can also be made available in a comparatively inexpensive manner, e.g. as regards mass production, preferably by stamping a metal sheet provided as carrier plate. The wall is a part which is monolithic with the remaining carrier plate, i.e. their is no material boundary therebetween.

A correspondingly stamped wall can then firstly delimit a cavity for the potting material during production, but secondly also be used for certain mechanical stabilization of the carrier plate; by virtue of a region of the metal sheet being re-formed from the metal-sheet plane, for example, warpage can be prevented.

The lower side of the metal sheet which is opposite the upper side can be provided as solderable surface, for example, can be provided with a precious metal coating, for example, so that the carrier plate can then be soldered on over a large area, which also provides advantages as regards thermal connection, for example. The carrier plate can generally be fitted on a heat sink, i.e. can be connected thereto over a large area via a thermally conductive paste, for example as well.

In general, the carrier plate material can also be provided in electrically insulating fashion, i.e. the carrier plate can be produced by injection-molding, for example; however, a metallic carrier plate material may be provided. The contact element may then not be provided in direct contact with the carrier plate, but an insulating body ("substrate plate"/"mounting body"), explained further below in detail, may be arranged therebetween.

In the case of the exemplary metallic carrier plate material, the "forming" of the wall may generally take place also by material deposition, in which the arrangement face is milled, for example, and the wall remains in place. However, re-forming of the carrier plate material, to be precise particularly preferably by means of stamping, may be provided.

The contact element is electrically conductively connected to the LED and is intended to a certain extent to produce a connection to the macroscopic, and then e.g. itself form a contact face, via which the contact can then be made with the LED module by a clamping, screw or soldered contact, for example. With a view to mass production, the power supply may be configured to be as simple as possible, i.e. to avoid where possible through-contacts through the carrier plate which are complex in terms of production, for example. In order to bring a contact element, which is passed correspondingly on the upper side of the carrier plate, from a connection point, i.e. where the electrically conductive connection to the LED is produced, to outside the arrangement region, the inventor has initially considered passing the conductor element via the wall; said connecting element would therefore have been provided so as to be completely peripheral, i.e. closed. In contrast, however, in this case the approach consists in optionally providing the wall not such that it is completely peripheral, but such that it is interrupted in the interruption region. The contact element can then be guided out of the arrangement region through the interruption region. The inventor has established that, in the case of a sufficiently small interruption region or an interruption region which, as explained in detail below, is closed by a closure body prior to the introduction of the potting material, firstly sufficient delimitation of the cavity is provided, and secondly the contact element may be guided as an intrinsically planar part through the interruption region, i.e. no complex "bridge geometry" needs to be realized, which can simplify production. In addition, a contact element which at least does not rise up substantially away from the surface of the carrier plate three-dimensionally may then be protected more effectively, for example, from damage as well during continued processing or use of the LED module.

Although the wall is interrupted in the interruption region (s), the inner wall face of the wall should extend over at least 70% or 80% of the areal extent of the arrangement face.

The LED is arranged "on" the arrangement face, which does not necessarily mean that the two need to be in direct contact with one another. As explained further in detail below, an insulating substrate plate, for example, can also be arranged between the LED and the carrier plate, for example together with a joining layer used for fitting the LED thereon (said joining layer can of course also be provided if the LED is fitted directly on the carrier plate without a substrate plate therebetween).

The "electrically conductive connection" between the contact element and the LED may be provided by a bonding wire; the connection may be, for example, a ball/wedge connection or a wedge/wedge connection. In general, the connection may be produced via a soldered connection, for example, however, i.e. an LED provided as SMD component part can therefore be connected to an LED connection face of the contact element by soldering, for example.

In general, "a"/"an"/"one" within the scope of this disclosure should be understood as meaning the indefinite article but it is of course also possible for a further interruption region with a further contact element to be provided, which is even preferred. Therefore, the anode contact can then be guided via a first contact element, for example, and the cathode contact via a further contact element.

Two interruption regions, each having a contact element, may be provided, wherein in general a plurality of contact elements can also be guided through an interruption region and/or a multiplicity (≥3) of contact elements can also be provided, for example if driver and/or control electronics are also provided on the arrangement face in addition to the LED. Secondly, an embodiment with precisely one contact element is possible if the LED is connected to a metallic carrier plate as second contact via a rear-side connection (in the presently used terminology, the rear-side connection is to a certain extent a "lower-side connection").

In various embodiments, a plurality of LEDs is provided on the arrangement face, for example at least 5, 10, 15 or 20 LEDs; possible upper limits can be approximately at most 100, 80, 60 or 40 LEDs. In general, the term "LED" can also relate to an already housed LED chip, which is thus positioned on the arrangement face and encapsulated (again). In various embodiments, however, the LED is an LED chip which has not been previously housed and which is then only housed with the potting material.

A plurality of arrangement faces may also be arranged on the carrier plate, with each of said arrangement faces being enclosed by a wall, and with the LEDs being arranged, for example in each case sorted according to color, in said arrangement faces; that is to say that three arrangement faces are possible, for example, i.e. in each case one for each of the colors red, green and blue. A plurality of arrangement faces can then also be "divided" in respect of the lateral delimitation of a dam, for example, i.e. one wall face thereof can adjoin one arrangement face and the opposite wall face the other arrangement face. However, a carrier plate with precisely one arrangement face, which may be circular, may be provided.

The "arrangement face" is enclosed laterally, i.e. in relation to the areal directions of the arrangement face, by the wall. In various embodiments, the arrangement face is planar and ends peripherally corresponding to the point at which the inner wall face of the wall is raised from the plane of the arrangement face and, in the case of the interruption region(s), at the point at which a projection of the potted body perpendicular to the arrangement face onto the upper side of the carrier plate ends.

The "wall" is raised with respect to the arrangement face by at least 200 µm, for example, and at least 600 µm, 1000 µm, 1250 µm and 1500 µm in order of increasing preference; upper limits which are independent of the lower limits can be at most 10 mm, e.g. at most 5 mm, for example. This height is taken perpendicular to the e.g. planar arrangement face, wherein in the case of a height which is not constant over the periphery, an average value formed over the periphery is taken into consideration (wherein the interruption region is not taken into consideration); by way of example, the height of the wall is constant over the periphery, however.

In general, the term "wall" is moreover not intended to imply that the surface profile outside, following the rising inner wall face of the wall, needs to drop again; the wall can also be provided as an elevation which extends from the arrangement face up to the rim of the carrier plate. However, a wall which has an outer wall face which is opposite the inner wall face as regards the areal directions, which outer wall face may be spaced apart from an outer edge of the carrier plate, may be provided. Such a wall which does not reach as far as the rim of the carrier plate is also referred to as a "dam" below.

By way of summary, the inner wall face of the wall is raised out of the plane of the arrangement face and the outer wall face of the wall then may drop into this plane again, to be precise particularly preferably spaced apart from the rim of the carrier plate. In other words, an outer rim region of the carrier plate (which adjoins the outer edge) and the arrangement region lie in the same plane, and the wall, in contrast, is formed out of this plane, even preferably by stamping.

Figure 2:
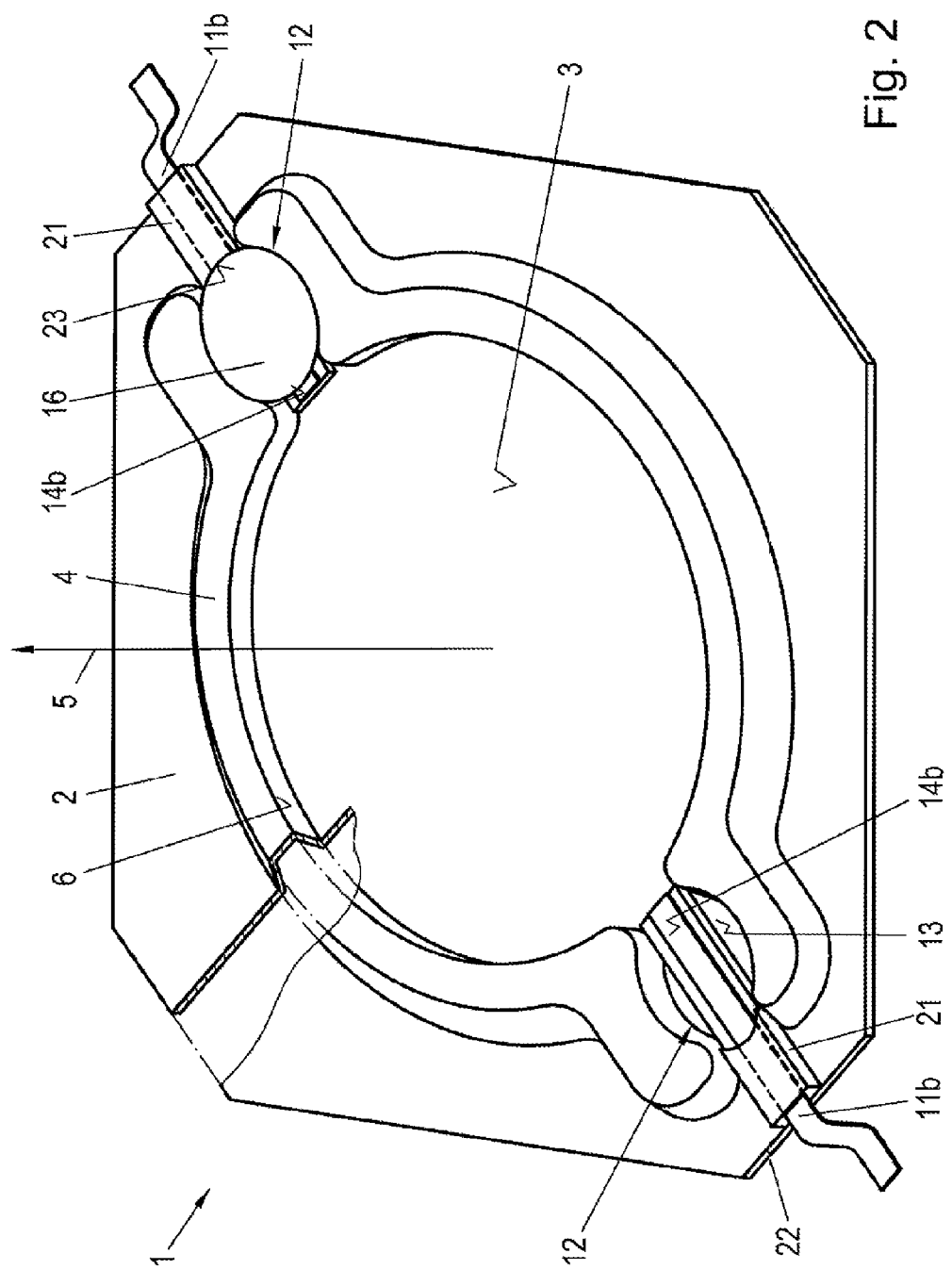
FIG. 2 shows a second LED module according to various embodiments in an angled view from above.

The contact element extending "along" the upper side of the carrier plate may be parallel to the plane of the preferably planar arrangement face, in any case as long as the contact element extends above the carrier plate; it can then be bent downwards as a connection pin, for example, laterally outside of the carrier plate (cf. FIG. 2, for example).

A wall formed from the carrier plate material, i.e. for example from a metallic material, may provide advantages in comparison with a dam applied consisting of a plastic material, for example, even as regards its own mechanical stability. A further component can then also be mounted on the wall, for example, such as a lens, a reflector and/or a phosphor element arranged spaced apart from the exit surface of the potted body (remote phosphor). The wall can therefore delimit the cavity which is open at the top by its inner wall face and at the same time provide a defined mounting face for attaching a further component on its upper side.

The wall is now first interrupted over its periphery in the "interruption region"; correspondingly, the inner wall face is also interrupted there, i.e. to a certain extent open, with the result that the contact element can extend outwards through this opening.

In a configuration, an interruption region face, i.e. the upper side of the carrier plate in the interruption region, may be planar per se and may lie in the same plane as the optionally likewise planar arrangement face. In various embodiments, the arrangement face merges directly with the interruption region face without any sudden change in height therebetween. In the case of the wall in the form of a dam, an abovementioned outer rim region face may lie in the same plane as well, wherein optionally the transition from the interruption region face to the outer rim region face is also stepless, without any change in height.

Insofar as reference is made within the scope of this disclosure to "at the top"/"at the bottom" and "above"/ "below" or an "upper side"/"lower side", reference is made to a height direction which is perpendicular to the optionally planar arrangement face and which points into the half-space into which the LED emits light at a light exit surface. The wall is raised in this height direction with respect to the arrangement face.

Specifications such as "laterally" or "inwards"/"outwards" relate to the directions perpendicular to the height direction, i.e. the areal directions of the optionally planar arrangement face. In the optional case of a wall in the form of a dam, said wall has a lateral extent in a respective areal direction which may correspond to at least 1 times, e.g. at least 2 times its height; possible upper limits are approximately 10 times, 8 times or 6 times its height. The lateral extent is in this case from the point at which the inner wall face is raised with respect to the plane of the optional planar arrangement face up to the point at which the outer wall face of the wall has then dropped again into this plane.

In a configuration, a closure body consisting of a plastic material ("closure body material") is arranged in the interruption region, said closure body covering a section of the contact element towards the top. During the production of the LED module, the closure body closes the wall which was previously open in the interruption region towards the side, i.e., together with the inner wall face of the wall, represents a lateral delimitation of the cavity which is open at the top. The potting material is then applied correspondingly to the inner wall face of the wall and in the interruption region to the closure body.

In various embodiments, the closure body covers a central section (as regards the longitudinal extent) of the contact element towards the top, i.e. a connection section which is proximal to the LED, in which connection section the electrically conductive connection to the LED is produced, remains free from the closure body and is then covered by the potted body material, i.e. by the potted body towards the top.

In various embodiments, free-flowing closure body material is applied and is cured on the carrier plate, specifically in the interruption region, to form the dimensionally stable closure body.

In various embodiments, which may provide advantages, for example, as regards the application of the closure body material, the interruption region face is enclosed over the majority of its areal extent by an enclosure face.

The enclosure face delimits the interruption region face therefore towards the side, with the result that the closure body material is to a certain extent held in position prior to or during the curing; in simple terms, therefore, "running" of the plastic material (forming the closure body) into the arrangement face, for example, is prevented.

The enclosure face is intended to extend over at least 60%, e.g. at least 70%, of the areal circumference of the interruption region face, wherein possible upper limits are at most 90% or 80%, for example. Optional in this case is an interruption region face which slots into a square, i.e. has a square shape itself or, for example, an octagonal shape, wherein a circular interruption region face may be provided. The circle is then enclosed corresponding to the abovementioned percentages. This enclosure just of the interruption of the wall is open correspondingly, i.e. proximal to the LED and distal with respect thereto. An enclosed interruption region may be provided, for example, if the interruption region face can have a certain size, i.e. the closure body material can be applied in easily reproducible fashion. Secondly, the correspondingly slightly larger quantity of closure body material is then nevertheless held together. In this context, but also generally, the interruption region can also be used for accommodating an electrical component, e.g. an ESD protective diode, in addition to passing through the contact element. Such a component arranged in the interruption region may then be encapsulated by injection molding with the closure body material and therefore protected from environmental influences.

In general, the volume of the closure body should only make up a fraction of that of the potted body, for example no more than 20%, 10% or 5% thereof, which can also prevent running of the potted body material during application, for example.

Various embodiments relate to a conductor bar provided as contact element, which is encapsulated by injection molding sectionally with a mounting body consisting of a plastic material and is positioned together with the mounting body on the carrier plate. The conductor bar may be a punched part, which is then encapsulated by injection molding with a molding composition in a method known from semiconductor backend manufacture; the mounting body is an injection-molded part. The mounting body may insulate the conductor bar over a large area with respect to the carrier plate, i.e. can in any case extend as far along the lower side of the conductor bar as this lower side faces the carrier plate, i.e. does not protrude laterally beyond the latter. In various embodiments, the conductor bar encapsulated by injection molding then namely forms a connection pin which protrudes beyond the carrier plate, namely distally to the LED, with which connection pin the LED module can be fitted in a similar manner to a chip housing. For this purpose, the connection pin may be bent downwards and may be in the form of a plug-through contact or be designed for surface mounting, for example. In the last-mentioned case, the conductor bar can therefore be curved again in an end region in order to then extend substantially parallel to and beneath the plane of the carrier plate away from said carrier plate.

By virtue of the conductor bar being encapsulated by injection molding, i.e. in at least one section of its longitudinal extent (from an end which is proximal to the LED to an end which is distal to the LED), it passes through the mounting body (i.e. is covered thereby at the bottom, top and at the side), the conductor bar is held effectively in the mounting body. This also imparts a certain degree of stability. The conductor bar which is sectionally encapsulated by injection molding by the mounting body is therefore then positioned together with said mounting body on the carrier plate. In this case, the mounting body (with the conductor bar therein) can also already close the interruption region, for example, generally, i.e. can delimit the arrangement face towards the side in such a way that during filling, largely no potting material emerges. After curing thereof, the potted body correspondingly adjoins the mounting body. It is optional, however, that the mounting body also delimits an interruption region face towards the side, which interruption region face is delimited partially by an enclosure face as described above, and then an above-described closure body is arranged in said interruption region face. The mounting body therefore may "close" an opening in the enclosure face which is distilled to the LED.

To this extent it is optional for production that at least the conductor bar is encapsulated by injection molding or a conductor bar which has already been encapsulated by injection molding by the mounting body is provided which is then arranged on the carrier plate, to be precise after forming of the wall. Once the LED(s) has/have been arranged and electrically conductively connected to the conductor bar, then initially the closure body material is introduced into the interruption region face also delimited by the mounting body, and the potting material is introduced into the cavity which is open at the top after curing of the closure body.

In general, the conductor bar which is encapsulated sectionally by injection molding forms an LED connection face proximal to the LED. As regards the optional connection to the LED via a bonding wire as well, the mounting body does not cover the conductor bar there at the top. Then, the section encapsulated by injection molding adjoins outwards, away from the LED.

In various embodiments, the conductor bar additionally forms, outside the arrangement face, and to be precise also outside the carrier plate, a contact face, which is used for making electrical contact with the LED module. This is in this case arranged on the lower side of the mounting body, i.e. the LED module is in the form of an SMD component part. The LED connection face is therefore not covered at the top by the mounting body proximal to the LED, and that section of the conductor bar which is sheathed completely by the mounting body adjoins (on the outside), wherein further on the outside the contact face which is not covered at the bottom by the mounting body (but e.g. at the top and further preferably also at the side) follows.

The downwardly pointing contact face can have an area of optionally at least $0.1$ mm$^2$, $0.25$ mm$^2$, $0.5$ mm$^2$, $0.75$ mm$^2$, $1$ mm$^2$, $1.25$ mm$^2$ or $1.5$ mm$^2$, of increasing preference in this order, for example; possible upper limits dependent thereon can be approximately at most $30$ mm$^2$, $20$ mm$^2$ and $10$ mm$^2$. The LED connection face, i.e. that region which is not covered at the top by the mounting body, can generally have an area of optionally at least $0.1$ mm$^2$, $0.5$ mm$^2$ or $1$ mm$^2$, in order of increasing preference (even if the conductor bar is in the form of a connection pin which is bent downwards distally with respect to the LED); possible upper limits are approximately at most $30$ mm$^2$, $20$ mm$^2$ and $10$ mm$^2$.

An optional mounting body may be provided such that a section thereof extends peripherally around the carrier plate, e.g. completely peripherally, with the result that the carrier plate is held in this mounting body section. When the conductor bar which is encapsulated sectionally by injection molding is positioned on the carrier plate, therefore, at the same time the carrier plate is inserted into this frame formed by the mounting body. If an above-described closure body is applied, this can be used also for fixing the carrier plate in the frame, for example; in addition or as an alternative, the carrier plate can be held by virtue of a form-fitting connection in the frame, for example, the edge of the carrier plate can therefore latch into a groove which is provided at least sectionally inside on the frame, for example.

As an alternative to the configuration as a conductor bar encapsulated by injection molding, in an optional configuration a conductor track may also be provided as contact element, which conductor track is arranged on an electrically insulating substrate plate. During production of the LED module, in turn the substrate plate is then positioned together with the conductor track on the carrier plate.

The substrate plate can be provided from a ceramic material, for example, in which case the conductor track is deposited correspondingly on the ceramic plate. Secondly, a printed circuit board can also be provided as substrate plate with conductor track, i.e. the substrate plate can then be provided on the basis of a plastic material, for example also a fiber-reinforced plastic material. The conductor track can also be formed by partial removal of a layer previously covering the printed circuit board areally, for example by etching. Depending on the configuration specifically, an effect of such a substrate plate with conductor track can consist, for example, in the good availability or else in the comparatively simple design.

In various embodiments, the substrate plate can also extend over a large area on the arrangement face, wherein "large area" means coverage of the arrangement face over at least 50%, 60%, 70%, 80% or 90%, in order of increasing preference. The substrate plate can also cover the arrangement face completely. In a configuration, therefore, a substrate plate which extends firstly through the interruption region and insulates the contact element (the conductor track) with respect to the carrier plate, may secondly also cover the arrangement face over a large area and insulate an LED arranged thereon with respect to the carrier plate.

In general, this is also possible in the case of an LED with a rear-side connection if the conductor track on the substrate plate reaches up to the LED and is connected thereto by soldering, for example. Secondly, an LED can also be fitted directly on the substrate plate, for example via a layer of adhesive.

In the case of a substrate plate which extends over a large area on the arrangement face, it is optional that the conductor track also extends into the arrangement region. The conductor track can extend, for example, along a rim of the substrate plate and in this case describe a curvature which is preset by the inner wall face of the wall and imaged by the rim of the substrate plate. In other words, the conductor track therefore extends to a certain extent peripherally around the arrangement face, for example over an angular range of at least 60°, 90° or 120°, based on the center point of said arrangement face; possible upper limits are approximately 240°, 210°, 180° or 170°. In various embodiments, in the case of a second interruption region, two conductor tracks can then together largely surround the arrangement face, i.e. the bonding wires can then be passed to the outside peripherally, for example.

A substrate plate which covers a large area of the arrangement face can also be interrupted, in a preferred configuration, where the LED is arranged, with the result that the LED can nevertheless be electrically conductively connected to the carrier plate via a rear-side connection, optionally by a soldered connection. Then, other LEDs can be arranged on the electrically insulating substrate plate, said LEDs being operated at a higher voltage, for example.

It is then possible, for example, for LEDs emitting light of different colors to be connected in series so that LEDs emitting blue light are provided at the start of this chain (high voltage end) and LEDs emitting red light are provided at the end of the chain (low voltage end); the voltage drop across the "red LEDs" is then therefore markedly lower than the voltage drop across the "blue LEDs", for example there may be around 400 V present at the start of the high voltage end, for example, but only around 50 V at the start of the low voltage end.

The red LEDs can therefore be connected directly to the carrier plate via a respective (thermal) rear-side connection, wherein, owing to the comparatively low voltage, the risk of electrical flashovers (to the carrier plate) is comparatively low. In the case of the blue LEDs, the risk of flashovers would be much higher, for which reason they are arranged flat on the substrate plate. The improved cooling can be of particular significance for the red LEDs because said LEDs can react in a more sensitive manner to the thermal boundary conditions.

A cutout or cutouts in the substrate plate can provide effects as regards thermal stability since LEDs can be connected effectively thermally to the carrier plate in a targeted manner, whereas other LEDs which output lower power losses and/or respond in a less sensitive manner to the thermal boundary conditions, for example, can be arranged on the substrate plate.

As already mentioned at the outset, various embodiments also relate to a method for producing an LED module as disclosed here, and the above details with respect to the LED module should also be interpreted expressly for the production of a corresponding LED module.

During production, first the wall is formed, then the contact element and LED are arranged, and then the potted body is applied, to be precise preferably by the cavity which is delimited laterally by the inner wall face of the wall and is open at the top being filled with a free-flowing potted body material, for example based on silicone, which then cures so as to adjoin the inner wall face.

In general, the wall could also be produced at the same time as the remaining carrier plate, for example when it is a cast/injection-molded part, and the wall is equally taken into consideration in the mold, which then releases the remaining carrier plate. In various embodiments, however, a metal sheet is provided as carrier plate, and the wall is formed by stamping.

In this case, the metal sheet is optionally not re-formed in the interruption region, i.e. it also maintains its original plate shape there, as in the region of the arrangement face.

The closure body provided in a preferred LED module is applied once the contact element has been arranged, for which purpose the closure body material is applied in a free-flowing state and then cured. If the closure body is dimensionally stable, i.e. it maintains its shape despite a certain deformability, the potting material can be applied and it is then positioned in the interruption region on the closure body; the closure body does not necessarily need to be non-deformable, i.e. rigid. The potting material can be provided on the basis of epoxide, for example, and can be thermally and/or UV-cured.

Various embodiments will be explained in more detail below with reference to exemplary embodiments, wherein also no further distinction is drawn between the various categories of claims and the features within the scope of the alternative independent claims may also be provided in another combination.

FIG. 1 shows a first LED module 1 according to various embodiments in an angled view from above. For reasons of clarity, the LEDs and the potted body covering said LEDs are not illustrated. The figure shows a carrier plate 2, with an arrangement face 3 formed on the upper side thereof according to the view in the figure. Then, a multiplicity of LEDs is arranged on this arrangement face 3, to be precise in this case soldered on via in each case one layer of solder for the thermal connection.

A dam 4 is provided peripherally around the arrangement face 3, said dam being formed monolithically from the same continuous carrier plate material, to be precise by stamping. That is to say that the dam 4 is pressed upwards out of the plane of the carrier plate 2, i.e. from a lower side which is opposite the upper side shown in the figure, i.e. said dam is raised in a height direction 5 with respect to the rest of the carrier plate 2 upwards, to be precise by approximately 2 mm. A section through the dam 4 is illustrated at the top left in the figure, which schematically illustrates the configuration of the stamped part.

An inner wall face 6 of the dam 4, together with the arrangement face 3, delimits a cavity which is open at the top, in which the LEDs are arranged. Then, a silicone potting compound is introduced into the cavity which is open at the top, and this silicone potting compound is then cured and the LEDs covered as potted body. As regards the height direction 5, the potted body reaches as far as the upper edge of the inner wall face 6.

In order to make electrical contact with the LEDs from outside, two contact elements are provided, namely two conductor tracks 11a arranged on a respective substrate plate 10.

The substrate plates 10 are each provided on a resin basis and insulate the respective conductor track electrically with respect to the metallic carrier plate 2.

For the arrangement of a respective substrate plate 10 with the respective conductor track 11a, the dam 4 is interrupted in two interruption regions 12, i.e. the carrier plate 2 is not re-formed (stamped) there out of the areal plane. In other words, a respective interruption region face 13 lies in the same plane as the arrangement face 3.

Correspondingly, a respectively planar substrate plate 10 can be positioned flat. The respective conductor track 11a extends outwards through the respective interruption region 12. A respective conductor track 11a forms an LED connection face 14a proximal to the LEDs and an LED module contact face 15a distally to the LEDs, at which contact face contact can be made "macroscopically" with the LED module 1, for example via a clamping contact.

The LEDs arranged on the arrangement face 3 are connected in series (via bonding wires from LED to LED), wherein the two LEDs each arranged at the ends of this series circuit are then each connected to the respective LED connection face 14a via a bonding wire.

As can be seen in FIG. 1, the interruption region face 13 has a circular basic shape, which facilitates the application of a potted body material based on epoxide, which material then closes the interruption region.

A corresponding closure body 16 is illustrated in the interruption region 12 arranged at the top right in the figure. During production of the LED module 1, both interruption regions 12 are closed with a respective closure body 16 once the substrate plates 10 with the conductor tracks 11a have been positioned. If said closure body is dimensionally stable after curing, it delimits, together with the inner wall face 6 of the dam 4, the cavity which is open at the top and prevents the potting material from escaping via the interruption regions 12.

The interruption region face 13 is laterally delimited by an enclosure face 17, which extends over approximately 70% of the areal circumference of the interruption region face. The closure body material is thus held effectively in position and can be cured.

FIG. 2 shows a further LED module 1 according to the invention, whose carrier plate 2 is provided similarly to that of the LED module 1 shown in FIG. 1. To this extent reference is made to the above description.

In the case of the LED module 1 shown in FIG. 2, however, a conductor bar 11b is provided as contact element, which conductor bar is encapsulated by injection molding with a mounting body 21. Therefore, the conductor bar 11b is arranged in a cavity, to which the free-flowing plastic material of the mounting body 21 is supplied, which is then cured. Then, the mounting body 21 and the conductor bar 11b passing through said mounting body are arranged together on the carrier plate 2.

In a section which is proximal to the LED, the mounting body 21 only extends beneath the conductor bar 11b, whereas it surrounds the conductor bar 11b in a central section and then ends approximately congruently with an outer edge 22 of the carrier plate 2.

The conductor bar 11b extends outside the carrier plate 2 downwards in curved fashion in order to then have an extent which is substantially to the plane of the carrier plate 2 but is offset downwards after a further curvature. The conductor bar 11b is in the form of a connection pin, distally with respect to the LED, which connection pin can then be soldered onto a printed circuit board, for example. The layer of solder is then formed between a lower side (not shown in the figure) of the distal end of the connection pin and the printed circuit board. Facing the interruption region 12, the mounting body 21 provides an interface 23 which delimits the interruption region face 13 towards the outside and which holds the closure body material which has then been introduced in position effectively. Moreover, the production of the LED module 1 as shown in FIG. 2 then proceeds similarly to the above description.

Figure 3:
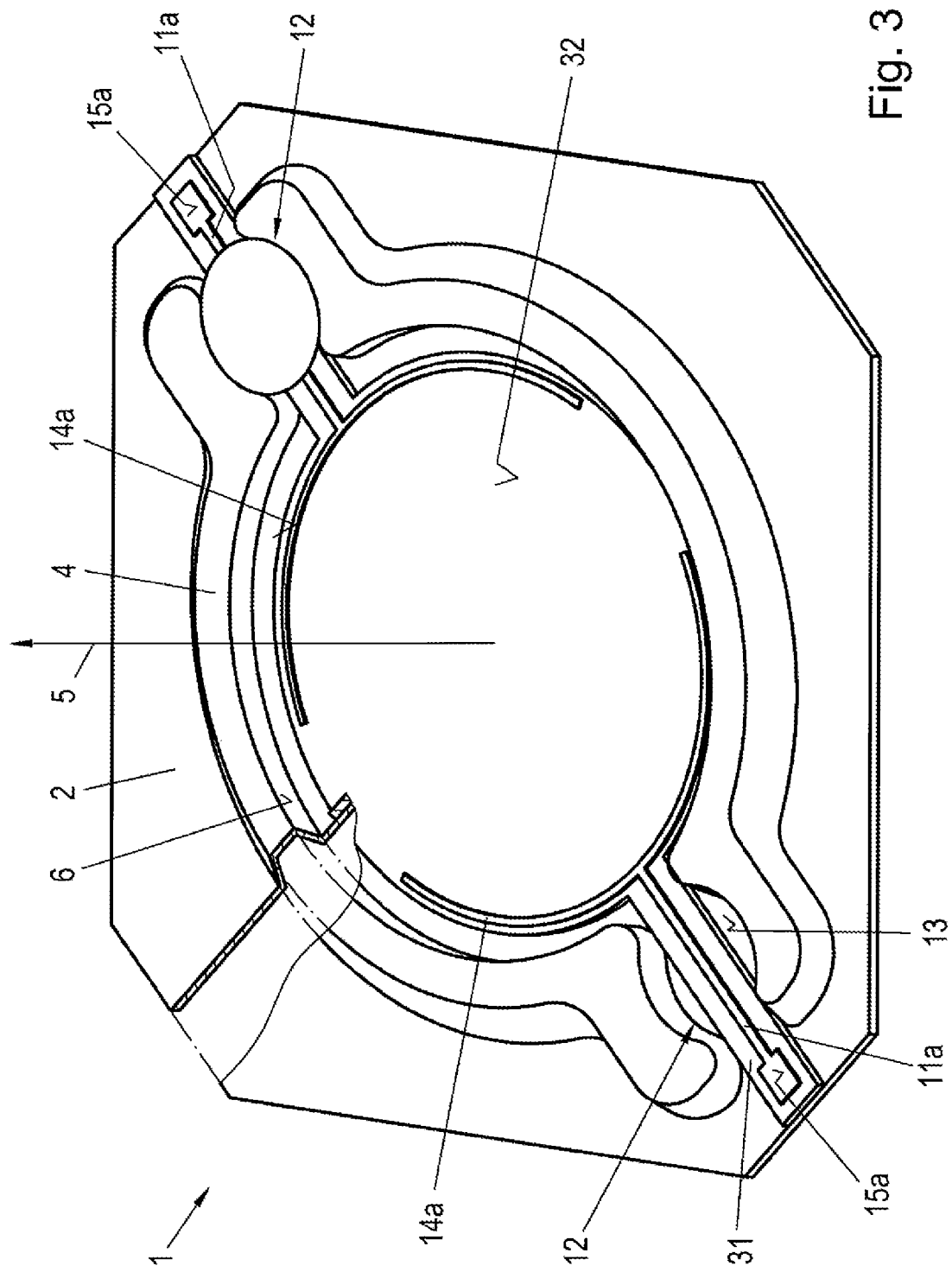
FIG. 3 shows a third LED module according to various embodiments in an angled view from above.

FIG. 3 shows a further LED module 1, whose carrier plate 2 corresponds to that of the LED modules shown in FIG. 1 and FIG. 2.

In this case, again a conductor track 11a is provided as contact element, which conductor track is arranged on a substrate material 31, namely a ceramic plate. This differs from the substrate plate 10 of the LED module 1 shown in FIG. 1 not only in terms of the substrate plate material, however, but also extends over a large area in the arrangement region and covers the arrangement face 3 completely at the top.

The ceramic plate 31 therefore provides an arrangement surface 32, on which the LEDs are fitted, to be precise in each case via a layer of adhesive. The ceramic plate 31 insulates the LEDs with respect to the carrier plate 2.

The respective LED connection face 14a of a respective conductor bar 11a in this case extends to a certain extent peripherally along that part of the ceramic plate 31 which covers the arrangement face 3, i.e. to a certain extent peripherally around the ceramic plate arrangement face 32. This provides more freedom as regards the positioning of the bonding wires.

Figure 4:
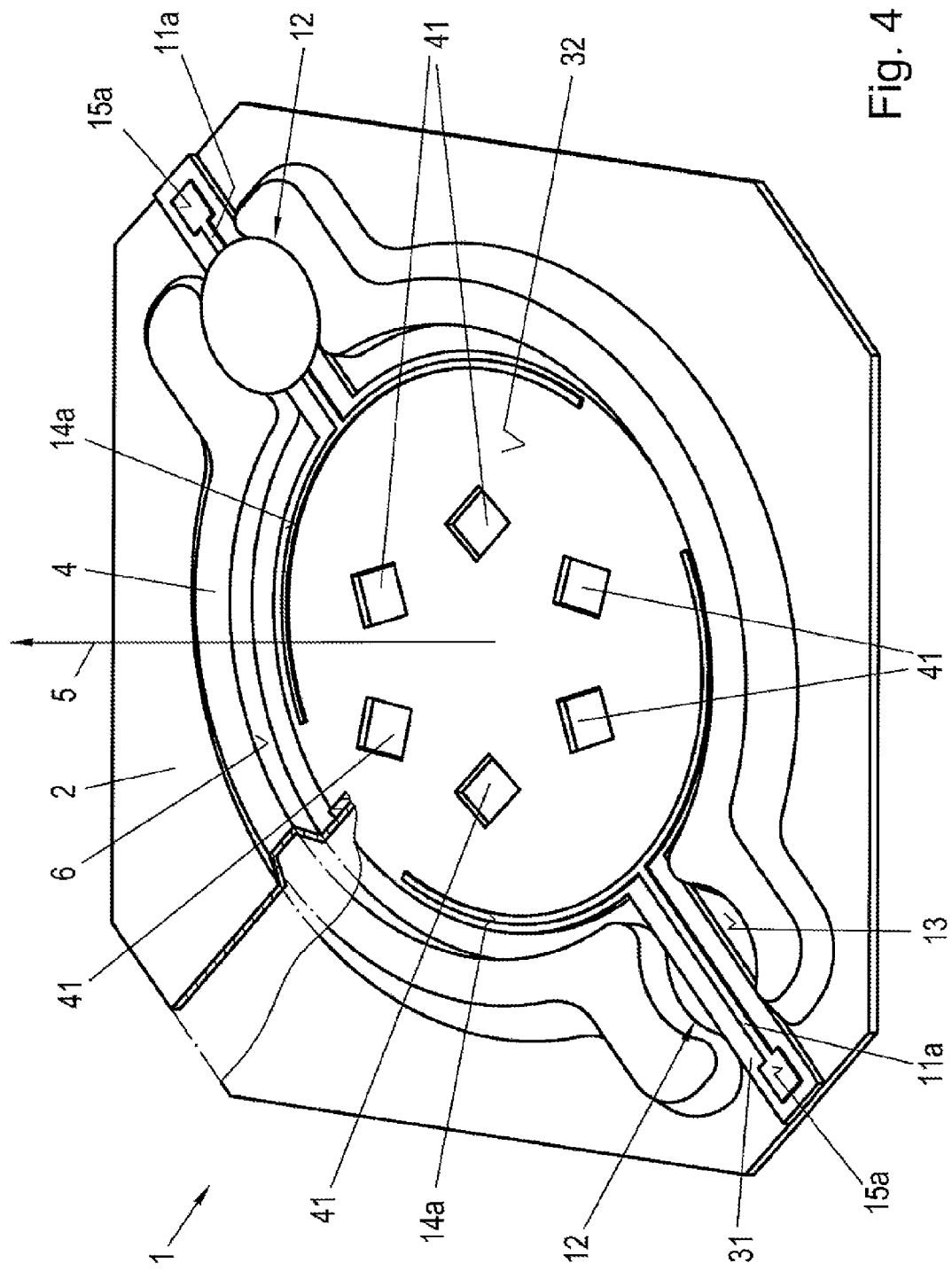
FIG. 4 shows the LED module shown in FIG. 3 in a modified configuration.

The LED module 1 shown in FIG. 4 largely corresponds to that shown in FIG. 3, but in this case cutouts 41 are provided in the ceramic plate 31, in which LEDs can be arranged and can be connected directly to the carrier plate 2 via a soldered connection. Then, some of the LEDs, optionally the blue LEDs, are provided on the ceramic plate 31 and therefore electrically insulated with respect to the carrier plate 2, and the other LEDs, namely preferably the red LEDs, are each connected thermally directly to the carrier plate 2 in a cutout 41 (but are connected electrically nevertheless to the remaining LEDs via bonding wires).

Figure 5:
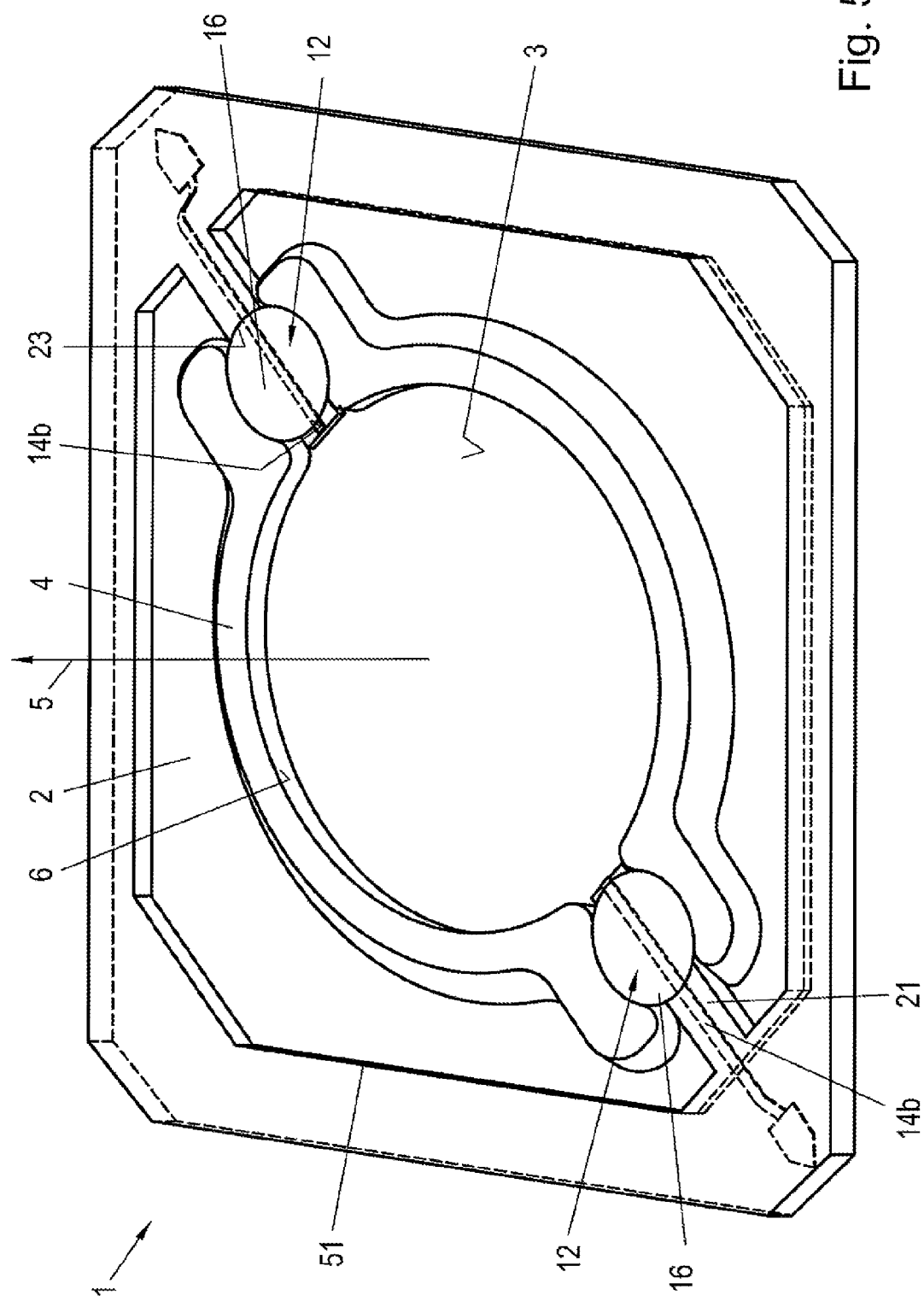
FIG. 5 shows a further LED module according to various embodiments in an angled view from above.
Figure 6:
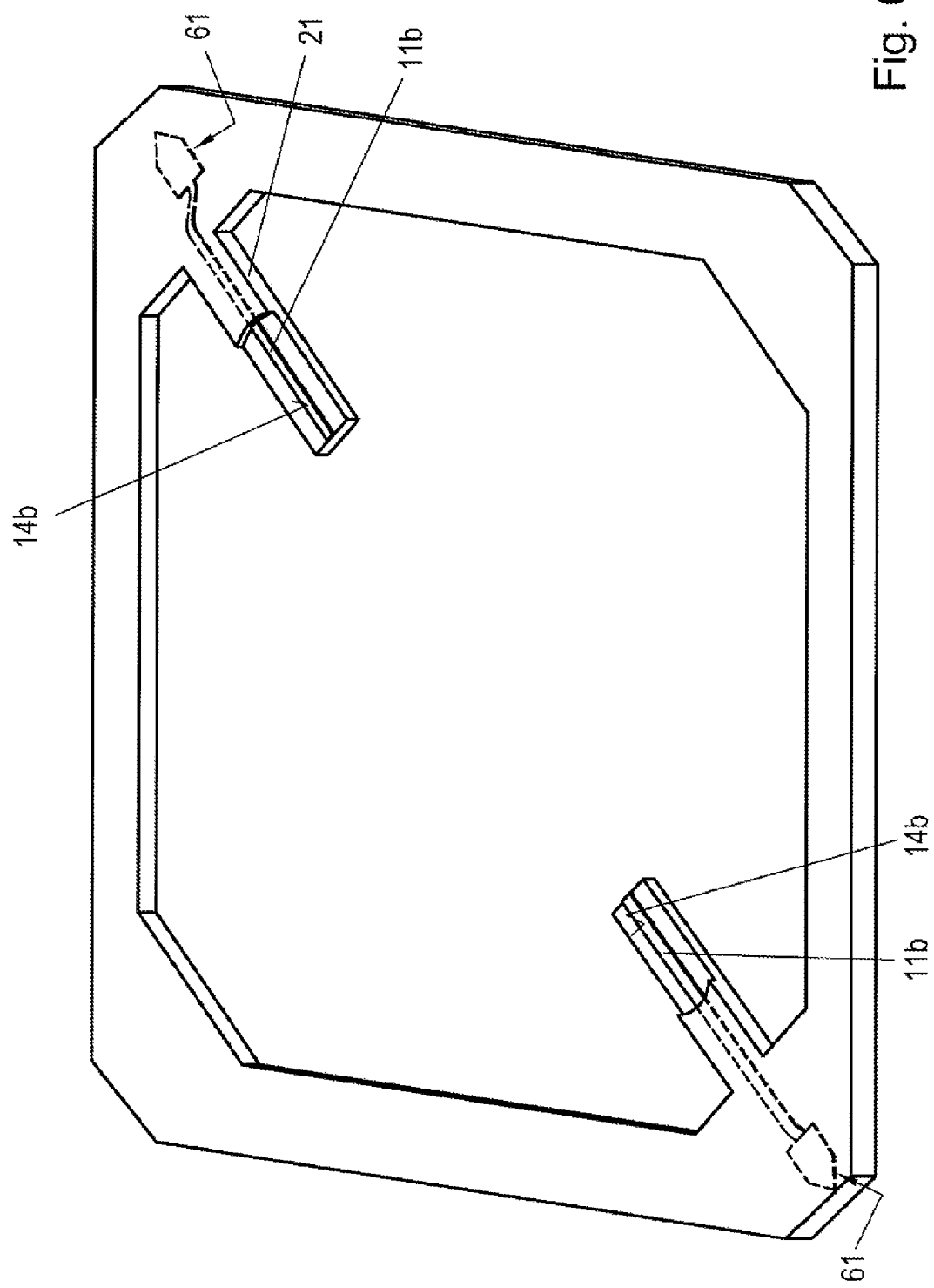
FIG. 6 shows the contact elements which have been encapsulated by injection molding by a mounting body of the LED module shown in FIG. 5 in a detailed illustration.

The LED module 1 shown in FIG. 5 is provided with conductor bars 11b encapsulated by injection molding, such as that shown in FIG. 2. FIG. 6 illustrates only the conductor bars 11b with the mounting body 21, in which they are embedded. In contrast to the embodiment shown in FIG. 2, the conductor bars 11b are not embedded in each case one dedicated mounting body, but in a common mounting body 21.

The mounting body 21 firstly receives the conductor bars 11b and secondly extends in the manner of a frame around the carrier plate 2. If the carrier plate 2 is inserted into the frame, at the same time the conductor bars 11b come to lie in the interruption regions. When the closure body 16 is applied, the carrier plate 2 is then fixed in the frame—it is held, with respect to an upwards movement, by an inwardly protruding rim 51 of the frame and by the closure body 16 in the opposite direction. The frame formed by the mounting body 21 provides certain protection for the carrier plate 2 and can also stabilize it to a certain extent.

FIG. 6 also shows the profile of the conductor bars 11b. A respective conductor bar 11b is arranged in each case in the region of the LED connection face 14b on the upper side of the mounting body 21, i.e. is not covered at the top thereby, in order that a bonding wire can be positioned from above. The conductor bars 11b then extend outwards in each case into the mounting body 21 and are surrounded by said mounting body and guided downwards therein, i.e. towards a lower side which is opposite the upper side shown in FIG. 6. There, each of the conductor bars 11b forms in each case one contact face 61, which is not covered at the bottom by the mounting body 21; with a view onto the LED module 1 from below, the contact faces are therefore exposed. The LED module 1 shown in FIG. 5 is thus designed for SMD (surface mounted device) fitting. The LED module 1 shown in FIG. 5 can then be mounted on a printed circuit board using a reflow soldering process, for example.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A light emitting diode module, comprising:
   a carrier plate, which has an arrangement face and a wall on the upper side of said carrier plate, said wall running peripherally around the arrangement face and being raised upwards with respect to said arrangement face;
   a light emitting diode, which is arranged on the arrangement face;
   a contact element, to which the light emitting diode is electrically conductively connected; and
   an at least partially transparent potted body, which covers the arrangement face and the light emitting diode towards the top and laterally adjoins an inner wall face of the wall;
   wherein the wall is formed monolithically with the remaining carrier plate;
   wherein the wall is interrupted over its periphery in an interruption region, and the potted body does not adjoin the inner wall face of the wall there accordingly;
   wherein, in addition, the contact element extends away from the arrangement face along the upper side of the carrier plate in the interruption region so that electrical contact can be made with the light emitting diode via the contact element from outside the potted body.

2. The light emitting diode module of claim 1,
   wherein the carrier plate material is a metallic material, and the carrier plate is provided as a metal sheet;
   wherein the wall is worked out of the metal sheet by stamping.

3. The light emitting diode module of claim 1,
   wherein the arrangement face is flat and also an interruption region face, i.e. the upper side of the carrier plate in the interruption region, is flat;
   wherein the arrangement face and the interruption region face lie in the same plane.

4. The light emitting diode module of claim 1,
   wherein a closure body consisting of a plastic material is arranged in the interruption region, with the closure body being laterally adjoined by the potted body and covering a section of the contact element towards the top.

5. The light emitting diode module of claim 4,
   wherein an interruption region face, i.e. the upper side of the carrier plate in the interruption region, has a face circumference, wherein an edge face formed by the wall extends over at least 60% of the face circumference and laterally delimits the interruption region face and adjoins the closure body.

6. The light emitting diode module of claim 1,
   wherein the contact element is a conductor bar, which is encapsulated by injection molding sectionally with a mounting body consisting of a plastic material and is positioned together with the mounting body on the carrier plate.

7. The light emitting diode module of claim 6,
   wherein a closure body consisting of a plastic material is arranged in the interruption region, with the closure body being laterally adjoined by the potted body and covering a section of the contact element towards the top;
   wherein the mounting body also delimits the interruption region face towards the side, with the result that the closure body laterally adjoins an interface of the mounting body.

8. The light emitting diode module of claim 6,
   wherein the conductor bar forms, proximal to the light emitting diode, a light emitting diode connection face, to be precise on the upper side of the mounting body, and the conductor bar forms, distally with respect to the light emitting diode, a contact face outside the carrier plate, with it being possible for electrical contact to be made areally with the light emitting diode module on said contact face;
   wherein this contact face is arranged on the lower side of the mounting body, i.e. the light emitting diode module is in the form of an SMD component part.

9. The light emitting diode module of claim 6,
   wherein a section of the mounting body extends peripherally around the carrier plate and the carrier plate is held in this mounting body section.

10. The light emitting diode module of claim 1,
    wherein the contact element is a conductor track, which is provided on an electrically insulating substrate plate;
    wherein the substrate plate is positioned together with the conductor track on the carrier plate.

11. The light emitting diode module of claim 10,
    wherein the arrangement face has an arrangement face area and the substrate plate extends over a large area on the arrangement face in such a way that the substrate plate covers the arrangement face over at least 50% of the arrangement face area.

12. The light emitting diode module of claim 11,
    wherein the carrier plate material is a metallic material and the substrate plate is interrupted where the light emitting diode is arranged;
    wherein the light emitting diode is electrically conductively connected directly to the carrier plate via a flat connecting layer.

13. The light emitting diode module of claim 12,
    wherein the light emitting diode is electrically conductively connected directly to the carrier plate via a layer of solder.

* * * * *